(12) United States Patent
Lin et al.

(10) Patent No.: US 12,024,780 B2
(45) Date of Patent: Jul. 2, 2024

(54) METHOD OF PREPARING METAL MASK SUBSTRATE

(71) Applicant: Darwin Precisions Corporation, Hsinchu County (TW)

(72) Inventors: Chi-Wei Lin, Hsinchu County (TW); Wen-Yi Lin, Hsinchu County (TW)

(73) Assignee: DARWIN PRECISIONS CORPORATION, Hsinchu County (TW)

(*) Notice: Subject to any disclaimer, the term of this patent is extended or adjusted under 35 U.S.C. 154(b) by 378 days.

(21) Appl. No.: 17/524,076

(22) Filed: Nov. 11, 2021

(65) Prior Publication Data

US 2022/0404695 A1    Dec. 22, 2022

(30) Foreign Application Priority Data

Jun. 16, 2021   (TW) .................. 110121947

(51) Int. Cl.
| | | |
|---|---|---|
| *C23F 1/00* | (2006.01) | |
| *C23C 14/02* | (2006.01) | |
| *C23F 1/02* | (2006.01) | |
| *C23F 1/04* | (2006.01) | |
| *C23F 1/14* | (2006.01) | |
| *C23F 1/16* | (2006.01) | |
| *C25F 3/16* | (2006.01) | |
| *G01N 21/57* | (2006.01) | |
| *G03F 1/60* | (2012.01) | |
| *C23C 14/04* | (2006.01) | |

(52) U.S. Cl.
CPC .............. *C23F 1/00* (2013.01); *C23C 14/028* (2013.01); *C23F 1/02* (2013.01); *C23F 1/04* (2013.01); *C23F 1/14* (2013.01); *C23F 1/16* (2013.01); *C25F 3/16* (2013.01); *G01N 21/57* (2013.01); *G03F 1/60* (2013.01); *C23C 14/042* (2013.01)

(58) Field of Classification Search
None
See application file for complete search history.

(56) References Cited

U.S. PATENT DOCUMENTS

| | | |
|---|---|---|
| 2009/0200263 A1 | 8/2009 | Piel et al. |
| 2018/0038002 A1 | 2/2018 | Tamura et al. |
| 2018/0066352 A1* | 3/2018 | Tamura .................. C23C 14/024 |

(Continued)

FOREIGN PATENT DOCUMENTS

| | | |
|---|---|---|
| CN | 107012421 A | 8/2017 |
| CN | 107406963 A | 11/2017 |

(Continued)

OTHER PUBLICATIONS

Arino et al., On the relationship between surface texture and gloss of injection-molded pigmented plastics, Polymer Engineering and Science—2005, pp. 1343-1356) (Year: 2005).*

*Primary Examiner* — Jiong-Ping Lu
(74) *Attorney, Agent, or Firm* — WPAT, P.C

(57) ABSTRACT

A method of preparing a metal mask substrate includes providing a metal substrate. Next, a gloss is measured and obtained from the surface of the metal substrate. Next, the gloss is determined whether to be within a predetermined range. When the gloss is determined within the predetermined range, a photolithography process is performed to the metal substrate, where the predetermined range is between 90 GU and 400 GU.

12 Claims, 4 Drawing Sheets

(56) References Cited

U.S. PATENT DOCUMENTS

| | | |
|---|---|---|
| 2018/0138410 A1 | 5/2018 | Fujito et al. |
| 2020/0399770 A1 | 12/2020 | Tamura et al. |
| 2021/0091312 A1 | 3/2021 | Fujito et al. |

FOREIGN PATENT DOCUMENTS

| | | | | |
|---|---|---|---|---|
| CN | 107849681 A | | 3/2018 | |
| CN | 109440062 A | | 3/2019 | |
| TW | 436843 B | | 5/2001 | |
| TW | 201718904 A | | 6/2017 | |
| WO | WO2022102729 | * | 5/2022 | ............. C23C 14/04 |

* cited by examiner

METHOD OF PREPARING METAL MASK SUBSTRATE

CROSS-REFERENCE TO RELATED APPLICATION

This application claims priority to Taiwan Application Serial Number 110121947, filed Jun. 16, 2021, which is herein incorporated by reference in its entirety.

BACKGROUND

Technical Field

The present disclosure relates to a process of a mask. More particularly, the present disclosure relates to a method of preparing metal mask substrate.

Description of Related Art

Nowadays, some display panels are manufactured by evaporation and using a metal mask, in which the metal mask has a plurality of openings. During the evaporation, plumes can pass through the openings and be deposited on a target substrate (e.g., a glass plate), so as to form a patterned layer. A conventional metal mask is usually manufactured by photolithography, so that the openings are defined by a photoresist pattern after development.

Current display panels have been developed towards a high resolution trend. Accordingly, the pitches among the openings of the metal mask need to be reduced, so that the metal mask can be used for manufacturing a high resolution display. However, once the pitches among the openings are reduced, the part of the photoresist pattern covering the area between two adjacent openings will also be reduced, so that the photoresist pattern may not completely cover the area between two adjacent openings during etching, resulting in the subsequent formation of some large and ineligible openings, even multiple openings communicating to each other, thereby causing a finished metal mask that is not suitable for or not capable of manufacturing the high resolution display panel.

SUMMARY

At least one embodiment of the disclosure provides a method of preparing metal mask substrate, so as to facilitate the formation of a plurality of uniformly sized openings.

A method of preparing metal mask substrate according to at least one embodiment of the disclosure includes providing a metal substrate having a surface. Afterward, a gloss is measured and obtained from the surface. Afterward, the gloss is determined whether to be within a predetermined range. When the gloss is determined within the predetermined range, a photolithography process is performed to the metal substrate, where the predetermined range is between 90 GU and 400 GU.

A method of preparing metal mask substrate according to another embodiment of the disclosure includes providing a metal substrate having a first surface and a second surface opposite to each other. Afterward, a first gloss is measured and obtained from the first surface, and a second gloss is measured and obtained from the second surface. Afterward, each of the first gloss and the second gloss is determined whether to be within the predetermined range. When both of the first gloss and the second gloss are within the predetermined range, a photolithography process is performed to the metal substrate, where the predetermined range is between 90 GU and 400 GU.

Based on the above, at least one embodiment of the disclosure provides a method of preparing metal mask substrate, in which the method uses the gloss to examine the surface of the metal substrate, so as to determine whether the roughness of the metal substrate is suitable for the photolithography process, thereby facilitating the formation of a metal mask having a plurality of uniformly sized openings.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
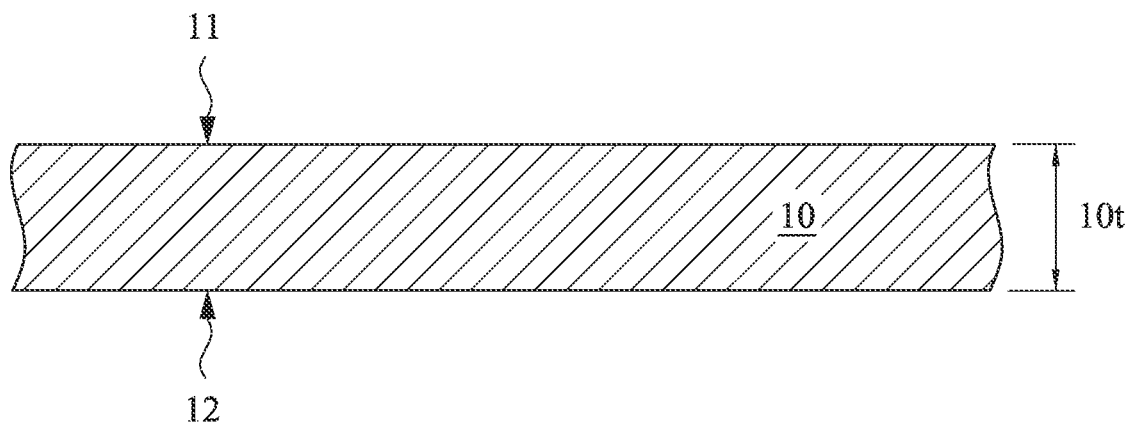
FIGS. 1A to 1C are schematic cross-sectional views of a method of preparing a metal mask substrate according to at least one embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions. Accordingly, the description and explanation of the following embodiments are not limited to the sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

Figure 1B:
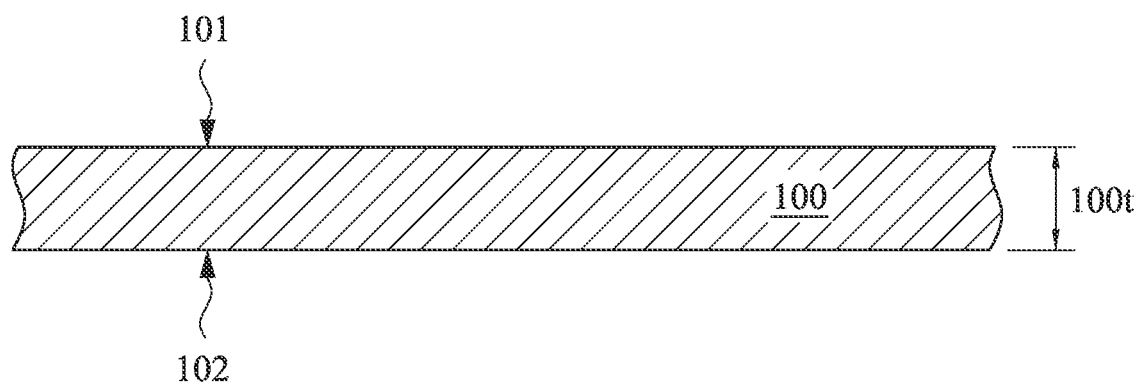
Figure 1C:
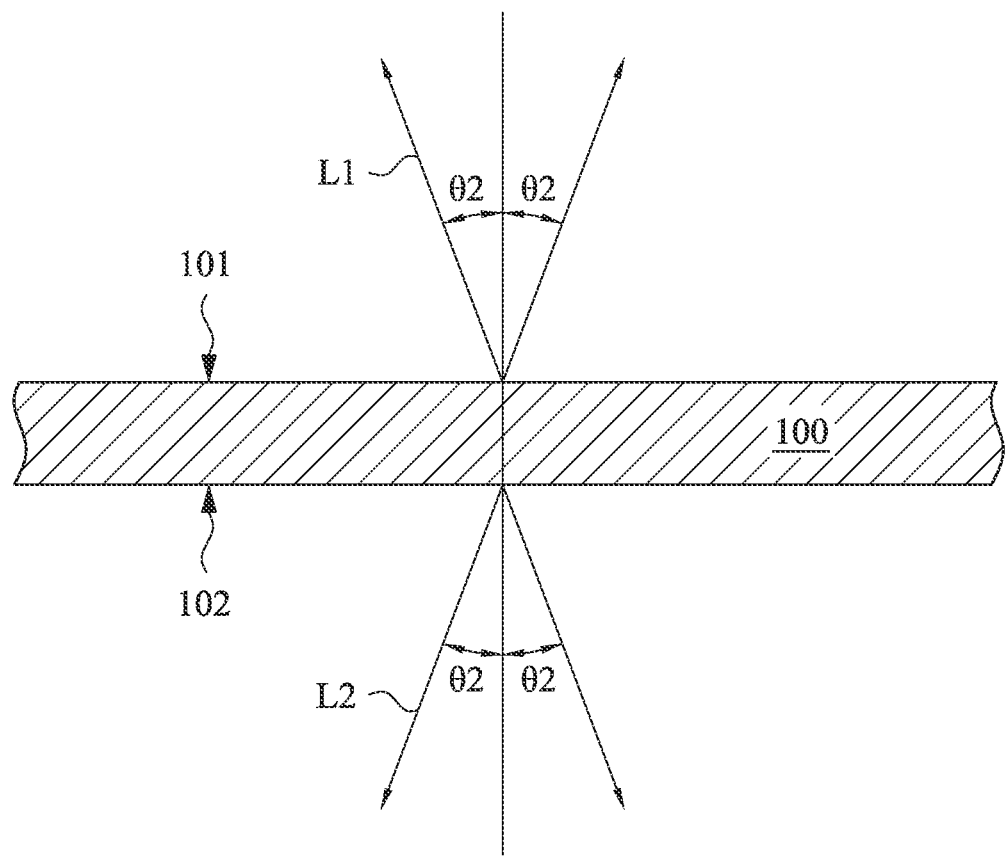

FIGS. 1A to 1C are schematic cross-sectional views of a method of preparing a metal mask substrate according to at least one embodiment of this disclosure. Referring to FIG. 1B, in the preparing method of the embodiment, first, a metal substrate 100 is provided, in which the metal substrate 100 has at least one surface. For example, the metal substrate 100 has a first surface 101 and a second surface 102 opposite to each other, where the first surface 101 may be an upper surface of the metal substrate 100, whereas the second surface 102 may be a lower surface of the metal substrate 100, as shown in FIG. 1B.

Referring to FIGS. 1A and 1B, the formation of the metal substrate 100 can include the following steps. First, an initial metal substrate 10 is provided. The initial metal substrate 10 may be a metal plate or a metal sheet, and has a thick thickness 10t, an upper surface 11 and a lower surface 12 opposite to each other. Basically, the roughness of both the upper surface 11 and the lower surface 12 may be not suitable for the attachment of the photoresist pattern, or unfavorable to the exposure in a photolithography process. Hence, if the photolithography process is performed to initial metal substrate 10 directly, it will be easy to manufacture a disqualified metal mask.

Afterward, an initial surface treatment is performed to the initial metal substrate 10, so as to improve the roughness of the initial metal substrate 10, where the initial surface treatment can include chemical etching, polishing, or electropolishing. The chemical etching can use an etchant, and the chemical etching can be wet etching. Since chemical etching, polishing, or electropolishing can remove the part of the initial metal substrate 10, the initial metal substrate 10 becomes a metal substrate 100 having a thin thickness 100t (as shown in FIG. 1B) after the initial surface treatment.

After the initial surface treatment, the roughness of the initial metal substrate 10 is improved, so that in comparison with both the upper surface 11 and the lower surface 12, the roughness of both the first surface 101 and the second surface 102 is more suitable for the attachment of the photoresist pattern, or more favorable to the exposure in the photolithography process. However, in order to maintain or improve the yield of the following photolithography process, the embodiment would pick a suitable metal substrate 100 by measuring the gloss of the metal substrate 100.

It is worth mentioning that in the embodiment, the metal substrate 100 is formed from the initial metal substrate 10 after the initial surface treatment. However, in other embodiment, the metal substrate 100 may not be formed by the initial surface treatment. Specifically, when the roughness of both the upper surface 11 and the lower surface 12 of the initial metal substrate 10 initially appears to be suitable for performing the photolithography process directly, the initial surface treatment can be skipped, that is, the initial metal substrate 10 can be the metal substrate 100.

Referring to FIG. 1C, afterward, a gloss is measured and obtained from at least one surface of the metal substrate 100 correspondingly. In the embodiment as shown in FIG. 1C, the glosses of two opposite surfaces of the metal substrate 100 can be measured. For example, a first gloss is measured and obtained from the first surface 101, whereas a second gloss is measured and obtained from the second surface 102. In addition, the glosses can be measured according to G20 standard gloss measurement. In other words, the first gloss and the second gloss are both measured according to the G20 standard gloss measurement.

Specifically, in the process of measuring the first gloss from the first surface 101, a first measuring light L1 can enter the first surface 101 at an angle θ2. Afterward, the first measuring light L1 reflects off the first surface 101. According to the law of reflection, the reflected first measuring light L1 leaves the first surface 101 at the other angle θ2 and is received by a glossmeter (not shown), so as to obtain the first gloss, in which each angle θ2 is substantially equal to 20°. That is, the first measuring light L1 is incident on the first surface 101 at the angle of incidence of 20° and then leaves the first surface 101 at the angle of emergence (i.e., the angle of reflection) of 20°.

Likewise, in the process of measuring the second gloss from the second surface 102, the second measuring light L2 can be incident on the second surface 102 at an angle θ2. The second measuring light L2 reflects off the second surface 102 and enters the glossmeter (not shown) at the other angle θ2, so that the glossmeter can receive the second measuring light L2, thereby obtaining the second gloss. Since each angle θ2 is substantially equal to 20°, the second measuring light L2 is incident on the second surface 102 at the angle of incidence of 20° and then leaves the second surface 102 at the angle of emergence (i.e., the angle of reflection) of 20°.

Afterward, the gloss is determined whether to be within a predetermined range. Since two glosses, the first gloss and the second gloss, are obtained in the embodiment, each of the first gloss and the second gloss is determined whether to be within the predetermined range after obtaining the first gloss and the second gloss, in which the predetermined range can be between 90 GU and 400 GU.

When the glosses (i.e., the first gloss and the second gloss) are determined not within the predetermined range, that is, for example, any one of the first gloss and the second gloss is not between 90 GU and 400 GU, a surface treatment is performed to the metal substrate 100, so as to make the glosses within the predetermined range (such as between 90 GU and 400 GU), where the surface treatment can be chemical etching. In addition, when the gloss (e.g., the first gloss or the second gloss) is not within the predetermined range (e.g., as between 90 GU and 400 GU), a variety of surface treatments can be performed to the metal substrate 100 depending on the different measured gloss.

Figure 2A:
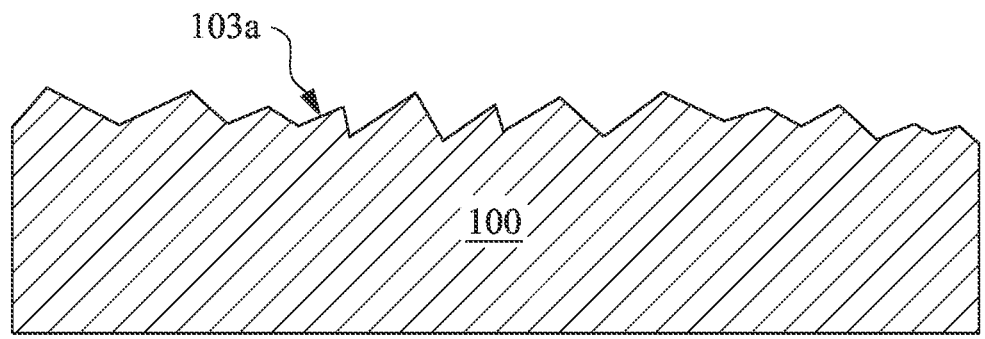
FIG. 2A is a schematic local cross-sectional view of the metal substrate in FIG. 1C which has a gloss less than 90 GU.

FIG. 2A is a schematic local cross-sectional view of the metal substrate in FIG. 1C which has a gloss less than 90 GU. Referring to FIG. 2A, when the gloss (i.e., at least one of the first gloss and the second gloss) is less than 90 GU, the surface (e.g., at least one of the first surface 101 and the second surface 102) of the metal substrate 100 is apparently a rough surface 103a, as shown in FIG. 2A.

The photoresist pattern is attached to the rough surface 103a easily, but the rough surface 103a is easy to cause scattering to affect the photoresist in the process of exposure, thereby resulting in the photoresist pattern which forms a plurality of non-uniformly sized openings easily after development, where the photoresist pattern is unfavorable to manufacture high resolution display panels. Hence, the surface treatment which is performed to the metal substrate 100 having the gloss (i.e., any one of the first gloss and the second gloss) less than 90 GU can immerse the metal substrate 100 in a first etchant with high viscosity coefficient and/or high concentration.

Figure 2B:
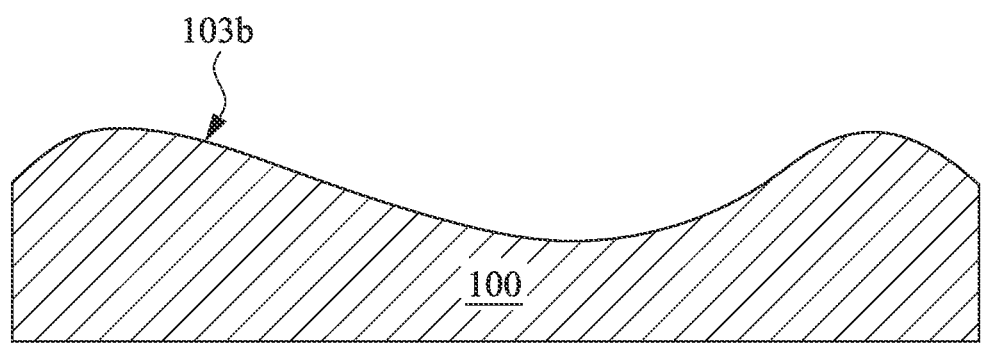
FIG. 2B is a schematic local cross-sectional view of the metal substrate in FIG. 1C which has a gloss greater than 400 GU.

FIG. 2B is a schematic local cross-sectional view of the metal substrate in FIG. 1C which has a gloss greater than 400 GU. Referring to FIG. 2B, when the gloss (i.e., at least one of the first gloss and the second gloss) is greater than 400 GU, the surface (e.g., at least one of the first surface 101 and the second surface 102) of the metal substrate 100 is apparently a smooth surface 103b, as shown in FIG. 2B. Although the smooth surface 103b is not easy to cause the scattering to affect the photoresist substantially, the smooth surface 103b is very undulating (as shown in FIG. 2B), so that the part of the photoresist pattern is removed from the smooth surface 103b easily after development. Therefore, it is difficult to attach the photoresist pattern to the smooth surface 103b stably, thereby manufacturing the disqualified metal mask easily.

Accordingly, the surface treatment which is performed to the metal substrate 100 having the gloss (i.e., any one of the first gloss and the second gloss) greater than 400 GU can immerse the metal substrate 100 in a second etchant with low viscosity coefficient and/or low concentration, in which the viscosity coefficient of the first etchant is greater than the viscosity coefficient of the second etchant, whereas the concentration of the first etchant is greater than the concentration of the second etchant. The second etchant can make the smooth surface 103b become flat, so that the photoresist pattern can be attached to the smooth surface 103b stably.

Figure 3A:
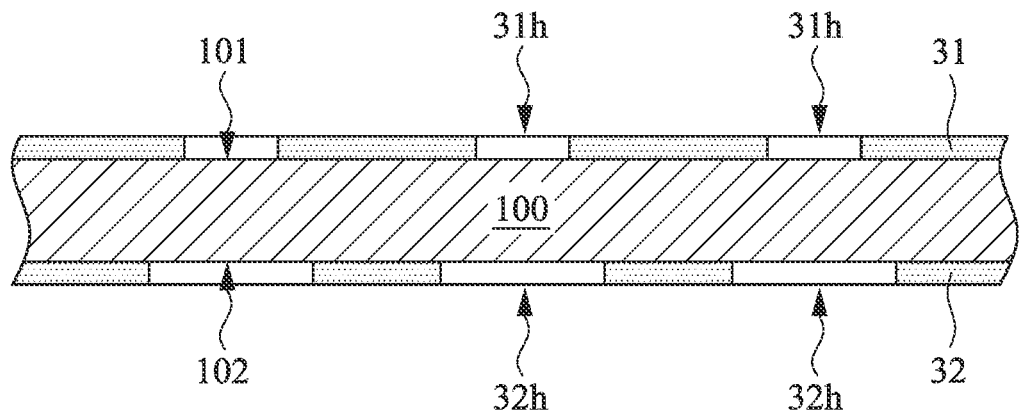
FIGS. 3A and 3B are schematic cross-sectional views of the metal substrate in FIG. 1C when the photolithography process is performed.
Figure 3B:
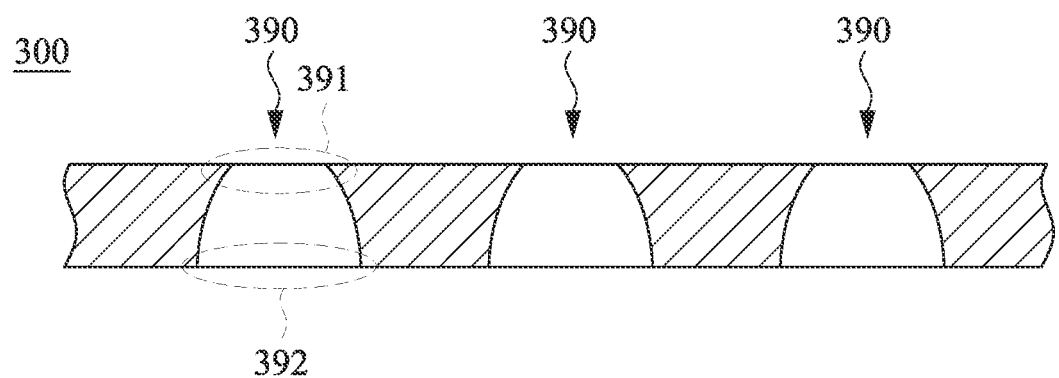

FIGS. 3A and 3B are schematic cross-sectional views of the metal substrate in FIG. 1C when the photolithography process is performed. Referring to FIGS. 3A and 3B, when the gloss is determined within the predetermined range, that is, for example, both the first gloss and the second gloss are within the predetermined range which is between 90 GU and 400 GU, it means that the surface (e.g., the first surface 101 and the second surface 102) of the metal substrate 100 has the three-dimensional surface roughness Sa which can range between 0.05 μm and 0.3 μm, whereas the surface of the metal substrate 100 has the maximum height of surface roughness Sz which can range between 0.5 μm and 3 μm. Thus, the above metal substrate 100 is basically suitable for the attachment of the photoresist pattern and favorable to the exposure process. Hence, the photolithography process can be performed to the metal substrate 100 having the first gloss and the second gloss both within the predetermined range.

Referring to FIG. 3A, during performing the above photolithography process, at least one photoresist pattern can be formed on the metal substrate 100. Taking FIG. 3A for example, a first photoresist pattern 31 and a second photoresist pattern 32 can be formed on the first surface 101 and the second surface 102 of the metal substrate 100 respectively. The first photoresist pattern 31 and the second photoresist pattern 32 can be formed by exposure and development processes, in which the first photoresist pattern 31 has a plurality of first through holes 31h, while the second photoresist pattern 32 has a plurality of second through holes 32h.

The first through holes 31h partially expose the first surface 101, and the second through holes 32h partially expose the second surface 102, in which the first through holes 31h align with the second through holes 32h separately. In addition, in the embodiment, the size of the first through hole 31h can be smaller than the size of the second through hole 32h apparently, as shown in FIG. 3A. However, in other embodiment, the size of the first through hole 31h can be substantially equal to the size of the second through hole 32h, so that FIG. 3A does not limit the size relation between the first through hole 31h and the second through hole 32h.

Referring to FIGS. 3A and 3B, afterward, the metal substrate 100 is etched by using the first photoresist pattern 31 and the second photoresist pattern 32 as masks, so as to remove the part of the metal substrate 100 which is exposed by the first through holes 31h and the second through holes 32h, thereby forming a plurality of openings 390. Each of the openings 390 has a first end opening 391 and a second end opening 392 opposite to each other, in which both the first end openings 391 and the second end openings 392 of the openings 390 are defined by the first photoresist pattern 31 and the second photoresist pattern 32 respectively. The first through holes 31h can form the first end openings 391, and the second through holes 32h can form the second end openings 392.

Since the size of the first through hole 31h is apparently smaller than the size of the second through hole 32h in the embodiment, the size of each of the first end openings 391 is apparently smaller than the size of each of the second end openings 392, thereby forming the opening 390 with an inconstant width. In addition, in other embodiment, the size of the first through hole 31h can be substantially equal to the size of the second through hole 32h, so that the size of the first end opening 391 can be substantially equal to the size of the second end opening 392. That is, the opening 390 also can have a constant width.

The openings 390 can be formed by chemical etching. That is, the formation of the openings 390 can immerse the metal substrate 100 covered by the first photoresist pattern 31 and the second photoresist pattern 32 in the etchant. Since the first through holes 31h align with the second through holes 32h separately, the first end openings 391 can align with the second end openings 392 one-to-one, so that a metal mask 300 having the plurality of openings 390 is basically complete.

It is necessary to note that the preparing methods disclosed by the above embodiments can measure the glosses (i.e., the first gloss and the second gloss) of two opposite surfaces of the metal substrate 100, and two photoresist patterns (i.e., the first photoresist pattern 31 and the second photoresist pattern 32) are formed on two opposite surfaces of the metal substrate 100 separately in the following photolithography process. Afterward, the metal substrate 100 is etched by using the two photoresist patterns as masks, so as to manufacture the metal mask 300.

However, in other embodiment, only one gloss (e.g., the first gloss or the second gloss) is measured from one single surface of the metal substrate 100, and the photolithography is performed only to one single surface of the metal substrate 100. Thus, the preparing method according to at least one of the embodiments of the disclosure can measure only one gloss of one single surface of the metal substrate 100, and it is not limited to the measurement of the glosses (i.e., the first gloss and the second gloss) from two opposite surfaces of the metal substrate 100.

Consequently, at least one embodiment of the disclosure uses the gloss to examine at least one surface of the metal substrate, so as to ensure the metal substrate having suitable roughness for the photolithography process and to reduce the disqualified metal mask, thereby facilitating the production of qualified metal masks having a plurality of uniformly sized openings. As a result, the preparing method according to at least one embodiment of the disclosure can help to cause the metal masks to use for manufacturing display panels, especially high resolution display panels, so as to satisfy the high resolution trend of current display panels.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of preparing a metal mask substrate, comprising:
   providing a metal substrate having a surface;
   measuring and obtaining a gloss from the surface, wherein the gloss is measured according to a G20 standard gloss measurement;
   determining whether the gloss is within a predetermined range;
   when the gloss is determined within the predetermined range, performing a photolithography process to the metal substrate, wherein the predetermined range is between 90 GU and 400 GU;
   when the gloss is determined within the predetermined range, performing a surface treatment to, the metal substrate, so as to make the gloss within the predetermined range,
   wherein performing the surface treatment to the metal substrate comprises:
      when the gloss is less than 90 GU, immersing the metal substrate in a first etchant; and
      when the gloss is greater than 400 GU, immersing the metal substrate in a second etchant, wherein a viscosity coefficient of the first etchant is greater than a viscosity coefficient of the secon etchant.

2. The method of claim 1, wherein a concentration of the first etchant is greater than a concentration of the second etchant.

3. The method of claim 1, wherein a three-dimensional surface roughness Sa of the surface ranges between 0.05 µm and 0.3 µm when the gloss ranges between 90 GU and 400 GU.

4. The method of claim 1, wherein a maximum height of surface roughness Sz of the surface ranges between 0.5 µm and 3 µm when the gloss ranges between 90 GU and 400 GU.

5. The method of claim 1, wherein a formation of the metal substrate comprises:
   providing an initial metal substrate; and
   performing an initial surface treatment to the initial metal substrate.

6. The method of claim 5, wherein the initial surface treatment comprises chemical etching, polishing, or electropolishing.

7. A method of preparing a metal mask substrate, comprising:
   providing a metal substrate having a first surface and a second surface opposite to the first surface;
   measuring and obtaining a first gloss from the first surface;
   measuring and obtaining a second gloss from the second surface, wherein the first gloss and the second gloss are measured according to a G20 standard gloss measurement;
   determining whether each of the first gloss and the second gloss is within a predetermined range; and
   when the first gloss and the second gloss are all determined within the predetermined range, performing a photolithography process to the metal substrate, wherein the predetermined range is between 90 GU and 400 GU;
   when any one of the first gloss and the second gloss is determined not between 90GU and 400 GU, performing a surface treatment to the metal substrate,
   wherein performing the surface treatment to the metal substrate comprises:
      when any ons of the first gloss and the second gloss is less than 90 GU, immersing the metal substrate in a first etchant; and
      when any one of the first gloss and the second gloss is greater than 400 GU, immersing the metal substrate in a second elchant, wherein a viscosity coefficient of the first elchant is greater than a viscosity coefficient of the second etchant.

8. The method of claim 7, wherein a concentration of the first etchant is greater than a concentration of the second etchant.

9. The method of claim 7, wherein a three-dimensional surface roughness Sa of each of the first surface and the second surface ranges between 0.05 µm and 0.3 µm when each of the first gloss and the second gloss ranges between 90 GU and 400 GU.

10. The method of claim 7, wherein a maximum height of surface roughness Sz of each of the first surface and the second surface ranges between 0.5 µm and 3 µm when each of the first gloss and the second gloss ranges between 90 GU and 400 GU.

11. The method of claim 7, wherein a formation of the metal substrate comprises:
   providing an initial metal substrate; and
   performing an initial surface treatment to the initial metal substrate.

12. The method of claim 11, wherein the initial surface treatment comprises chemical etching, polishing, or electropolishing.

* * * * *